(12) United States Patent
Topolewski et al.

(10) Patent No.: US 9,615,490 B2
(45) Date of Patent: Apr. 4, 2017

(54) COLDPLATE WITH INTEGRATED DC LINK CAPACITOR FOR COOLING THEREOF

(71) Applicant: Lear Corporation, Southfield, MI (US)

(72) Inventors: John N. Topolewski, Westland, MI (US); Michael Scott Duco, Fraser, MI (US); Parminder Brar, Windsor (CA); Rutunj Rai, Canton, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 14/805,664

(22) Filed: Jul. 22, 2015

(65) Prior Publication Data

US 2015/0334875 A1    Nov. 19, 2015

Related U.S. Application Data

(63) Continuation-in-part of application No. 14/288,857, filed on May 28, 2014, now Pat. No. 9,362,040.

(60) Provisional application No. 61/993,767, filed on May 15, 2014.

(51) Int. Cl.
*H05K 7/20* (2006.01)
*H02B 1/56* (2006.01)
*H02B 1/01* (2006.01)

(52) U.S. Cl.
CPC ........... *H05K 7/20927* (2013.01); *H02B 1/01* (2013.01); *H02B 1/56* (2013.01); *H05K 7/20254* (2013.01)

(58) Field of Classification Search
CPC .. H01L 23/367; H05K 7/209; H05K 7/20254; H05K 7/20918; H05K 1/0203; H05K 1/0272; H05K 7/1432; H05K 7/20854; H05K 7/2089; H01G 2/04; H01G 4/38; H01G 2/08; H01G 11/10; H01G 11/82; H01G 11/78; H01G 2/14; H01G 4/232; G06F 1/20; G06F 2200/201; G06F 1/206; H02B 1/56; H02B 1/01
See application file for complete search history.

(56) References Cited

U.S. PATENT DOCUMENTS

| 3,604,082 A | 9/1971 | McBrayer et al. |
| 3,622,846 A | 11/1971 | Reimers |
| 3,660,353 A | 5/1972 | Corman et al. |
| 4,628,407 A | 12/1986 | August et al. |
| 4,670,814 A | 6/1987 | Matsui et al. |

(Continued)

FOREIGN PATENT DOCUMENTS

| CN | 2742712 | 11/2005 |
| CN | 101606210 | 12/2009 |

(Continued)

OTHER PUBLICATIONS

Intellectual Property Office, Combined Search and Examination Report for the corresponding Great Britain Patent Application No. GB1612283.0 dated Jan. 17, 2017.

*Primary Examiner* — Courtney Smith
*Assistant Examiner* — Michael Matey
(74) *Attorney, Agent, or Firm* — Brooks Kushman P.C.

(57) ABSTRACT

A coldplate for use with an inverter of an electric vehicle includes a coldplate member. The coldplate member includes a pocket configured to receive a DC link capacitor of the inverter therein. The pocket is sized to surround the DC link capacitor when the DC link capacitor is received within the pocket to thereby provide physical integration of the DC link capacitor in the coldplate member.

9 Claims, 4 Drawing Sheets

(56) References Cited

U.S. PATENT DOCUMENTS

| | | |
|---|---|---|
| 4,872,102 A | 10/1989 | Getter |
| 5,091,823 A | 2/1992 | Kanbara et al. |
| 5,239,443 A | 8/1993 | Fahey et al. |
| 5,367,437 A | 11/1994 | Anderson |
| 5,408,209 A | 4/1995 | Tanzer et al. |
| 5,469,124 A | 11/1995 | O'Donnell et al. |
| 5,498,030 A | 3/1996 | Hill et al. |
| 5,504,655 A | 4/1996 | Underwood et al. |
| 5,634,262 A | 6/1997 | O'Donnell et al. |
| 5,740,015 A | 4/1998 | Donegan et al. |
| 5,749,597 A | 5/1998 | Saderholm |
| 5,940,263 A | 8/1999 | Jakoubovitch |
| 5,949,191 A | 9/1999 | Cassese et al. |
| 5,973,923 A | 10/1999 | Jitaru |
| 6,031,751 A | 2/2000 | Janko |
| 6,045,151 A | 4/2000 | Wu |
| 6,087,916 A | 7/2000 | Kutkut et al. |
| 6,144,276 A | 11/2000 | Booth |
| 6,201,701 B1 | 3/2001 | Linden et al. |
| 6,206,466 B1 | 3/2001 | Komatsu |
| 6,222,733 B1 | 4/2001 | Gammenthaler |
| 6,262,891 B1 | 7/2001 | Wickelmaier et al. |
| 6,313,991 B1 | 11/2001 | Nagashima et al. |
| 6,326,761 B1 | 12/2001 | Tareilus |
| 6,386,577 B1 | 5/2002 | Kan et al. |
| 6,430,024 B1 | 8/2002 | Gernert |
| 6,450,528 B1 | 9/2002 | Suezawa et al. |
| 6,466,441 B1 | 10/2002 | Suzuki |
| 6,529,394 B1 | 3/2003 | Joseph et al. |
| 6,819,561 B2 | 11/2004 | Nartzell et al. |
| 6,839,240 B2 | 1/2005 | Skofljanec et al. |
| 6,844,802 B2 | 1/2005 | Drummond et al. |
| 6,943,293 B1 | 9/2005 | Jeter et al. |
| 7,050,305 B2 | 5/2006 | Thorum |
| 7,109,681 B2 | 9/2006 | Baker et al. |
| 7,130,197 B2 | 10/2006 | Chin |
| 7,164,584 B2 | 1/2007 | Walz |
| 7,173,823 B1 | 2/2007 | Rinehart et al. |
| 7,204,299 B2 | 4/2007 | Bhatti et al. |
| 7,212,407 B2 | 5/2007 | Beihoff et |
| 7,236,368 B2 | 6/2007 | Maxwell et al. |
| 7,264,045 B2 | 9/2007 | Mehendale et al. |
| 7,289,329 B2 | 10/2007 | Chen et al. |
| 7,295,448 B2 | 11/2007 | Zhu |
| 7,375,287 B2 | 5/2008 | Rathmann |
| 7,375,974 B2 | 5/2008 | Kirigaya |
| 7,443,692 B2 | 10/2008 | Patwardhan et al. |
| 7,471,534 B2 | 12/2008 | Andersson et al. |
| 7,479,020 B2 | 1/2009 | Whitton |
| 7,554,817 B2 | 6/2009 | Nakakita et al. |
| 7,579,805 B2 | 8/2009 | Saito et al. |
| 7,646,606 B2 | 1/2010 | Rytka et al. |
| 7,660,099 B2 | 2/2010 | Imamura et al. |
| 7,710,723 B2 | 5/2010 | Korich et al. |
| 7,726,440 B2 | 6/2010 | Aisenbrey |
| 7,742,303 B2 | 6/2010 | Azuma et al. |
| 7,788,801 B2 | 9/2010 | Oggioni et al. |
| 7,791,887 B2 | 9/2010 | Ganev et al. |
| 7,798,833 B2 | 9/2010 | Holbrook |
| 7,800,257 B2 | 9/2010 | Lu |
| 7,804,688 B2 | 9/2010 | Wakabayashi et al. |
| 7,864,506 B2 | 1/2011 | Pal et al. |
| 7,869,714 B2 | 1/2011 | Patel et al. |
| 7,907,385 B2 | 3/2011 | Korich et al. |
| 7,920,039 B2 | 4/2011 | Shabany et al. |
| 7,952,225 B2 | 5/2011 | Reichard et al. |
| 7,952,876 B2 | 5/2011 | Azuma et al. |
| 7,957,166 B2 | 6/2011 | Schnetzka et al. |
| 7,974,101 B2 | 7/2011 | Azuma et al. |
| 8,040,005 B2 | 10/2011 | Bhatti |
| 8,064,198 B2 | 11/2011 | Higashidani et al. |
| 8,064,234 B2 | 11/2011 | Tokuyama et al. |
| 8,072,758 B2 | 12/2011 | Groppo et al. |
| 8,098,479 B1 | 1/2012 | Parler, Jr. et al. |
| 8,110,415 B2 | 2/2012 | Knickerbocker et al. |
| 8,169,780 B2 | 5/2012 | Yoshino et al. |
| 8,376,069 B2 | 2/2013 | Nakatsu et al. |
| 8,416,574 B2 | 4/2013 | Tokuyama et al. |
| 8,422,230 B2 | 4/2013 | Aiba et al. |
| 8,582,291 B2 | 11/2013 | Nakasaka et al. |
| 8,582,294 B2 | 11/2013 | Guerin et al. |
| 8,654,527 B2 | 2/2014 | Wei et al. |
| 8,665,596 B2 | 3/2014 | Brereton |
| 8,675,364 B2 | 3/2014 | Tokuyama et al. |
| 8,780,557 B2* | 7/2014 | Duppong ............... H05K 7/209 165/80.4 |
| 8,971,041 B2 | 3/2015 | Sharaf et al. |
| 2002/0106414 A1 | 8/2002 | Gernert |
| 2002/0130495 A1 | 9/2002 | Lotspih et al. |
| 2003/0053298 A1 | 3/2003 | Yamada et al. |
| 2005/0263273 A1 | 12/2005 | Crumly |
| 2007/0240867 A1 | 10/2007 | Amano et al. |
| 2007/0246191 A1 | 10/2007 | Behrens et al. |
| 2008/0117602 A1 | 5/2008 | Korich et al. |
| 2009/0009980 A1* | 1/2009 | Ward .................... H02M 7/003 361/807 |
| 2010/0078807 A1 | 4/2010 | Schulz |
| 2010/0081191 A1 | 4/2010 | Woods |
| 2010/0157640 A1 | 6/2010 | Azuma et al. |
| 2010/0254093 A1 | 10/2010 | Oota et al. |
| 2010/0328883 A1 | 12/2010 | Ledezma et al. |
| 2010/0328893 A1 | 12/2010 | Higashidani et al. |
| 2011/0116235 A1 | 5/2011 | Ryu et al. |
| 2011/0214629 A1 | 9/2011 | Benoit |
| 2011/0222240 A1 | 9/2011 | Kawata et al. |
| 2011/0235276 A1 | 9/2011 | Hentschel et al. |
| 2011/0267778 A1 | 11/2011 | Eckstein et al. |
| 2012/0031598 A1 | 2/2012 | Han et al. |
| 2012/0206950 A1 | 8/2012 | Duppong et al. |
| 2012/0235290 A1 | 9/2012 | Morelle et al. |
| 2013/0039009 A1 | 2/2013 | Shin et al. |
| 2013/0044434 A1 | 2/2013 | Sharaf et al. |
| 2013/0113074 A1* | 5/2013 | Ebersberger ............. H01G 2/08 257/532 |
| 2013/0170269 A1 | 7/2013 | Sharaf et al. |
| 2013/0215573 A1 | 8/2013 | Wagner et al. |
| 2013/0223009 A1 | 8/2013 | Nakatsu et al. |
| 2013/0258596 A1* | 10/2013 | Sharaf .............. H05K 7/20927 361/702 |
| 2013/0312933 A1* | 11/2013 | Sharaf .............. H05K 7/20254 165/80.4 |
| 2014/0069615 A1 | 3/2014 | Kusaka |
| 2014/0286064 A1* | 9/2014 | Kamizuma ............ H01G 4/258 363/123 |
| 2014/0334105 A1* | 11/2014 | Chen .................. H05K 7/20509 361/714 |
| 2015/0334874 A1* | 11/2015 | Rai .................... H05K 7/20254 361/699 |

FOREIGN PATENT DOCUMENTS

| | | |
|---|---|---|
| CN | 101981638 | 2/2011 |
| CN | 102013319 | 4/2011 |
| DE | 102007054618 A1 | 6/2008 |
| DE | 102008033473 A1 | 5/2009 |
| EP | 1028439 | 8/2000 |
| EP | 1484774 | 12/2004 |
| FR | 2903057 | 1/2008 |
| JP | 4256397 | 9/1992 |
| JP | 07297043 | 11/1995 |
| JP | 200454358 A | 9/2004 |
| JP | 2007273774 | 10/2007 |
| JP | 2008078350 | 4/2008 |
| JP | 2008085168 | 4/2008 |
| JP | 2011182500 A | 9/2011 |
| KR | 20160062447 A | 6/2016 |
| WO | 2010144399 | 12/2010 |
| WO | 2011138156 | 11/2011 |

* cited by examiner

COLDPLATE WITH INTEGRATED DC LINK CAPACITOR FOR COOLING THEREOF

CROSS-REFERENCE TO RELATED APPLICATIONS

This application is a continuation-in-part of U.S. application Ser. No. 14/288,857, filed May 28, 2014; which claims the benefit of U.S. Provisional Application No. 61/993,767, filed May 15, 2014; the disclosures of which are hereby incorporated in their entirety by reference herein.

TECHNICAL FIELD

The present disclosure relates to coldplates for cooling electrical components of inverters of electric vehicles.

BACKGROUND

An automotive vehicle powered fully or partially by an electric motor is referred to herein as an "electric vehicle" (e.g., a fully electric vehicle (EV), a hybrid electric vehicle (HEV), a plug-in hybrid electric vehicle (PHEV), etc.).

An electric vehicle includes an inverter for converting direct current (DC) voltage supplied by a high-voltage (HV) battery of the vehicle to an alternating current (AC) voltage for powering the motor. The inverter includes switching modules, such as integrated gate bipolar transistor (IGBT) modules, and a DC link capacitor having film capacitors. In converting a DC voltage input to an AC voltage output, the film capacitors of the DC link capacitor generate heat as a result of the switching operations of the IGBT power modules. The generated heat should be dissipated so that the inverter may continue to operate efficiently. The generated heat may be dissipated using a coldplate provided as part of the inverter.

Due to the heat generated as a result particularly of the operation of the DC link capacitor, a need exists for additional heat dissipation beyond that which may be provided by standard coldplates currently in use with inverters of electric vehicles.

SUMMARY

A coldplate for use with an inverter of an electric vehicle includes a coldplate member. The coldplate member includes a pocket configured to receive a DC link capacitor of the inverter therein. The pocket is sized to surround the DC link capacitor when the DC link capacitor is received within the pocket to thereby provide physical integration of the DC link capacitor in the coldplate member.

The coldplate may further include a second coldplate member. The coldplate members are adapted to be joined together to form a manifold therebetween proximate to the pocket to receive a fluid for use in cooling the DC link capacitor when the DC link capacitor is received within the pocket.

The coldplate may further include a potting material received within the pocket. The potting material surrounds the DC link capacitor when the DC link capacitor is received within the pocket. The potting material provides heat transfer, electrical isolation, and mechanical support to the DC link capacitor when the DC link capacitor is received in the pocket.

The pocket may have a depth corresponding to a height of the DC link capacitor. The pocket may have a shape corresponding to a shape of the DC link capacitor.

The pocket includes a floor and one or more walls. The floor is arranged on a side of the coldplate member and the walls extend from the floor of the pocket outward from the side of the coldplate member whereby the pocket opens outward from the side of the coldplate member.

An assembly for an electric vehicle includes an inverter and a coldplate. The inverter includes a DC link capacitor. The coldplate includes a coldplate member having a pocket. The DC link capacitor is received within and surrounded by the pocket to thereby be physically integrated in the coldplate.

The DC link capacitor may be a naked DC link capacitor lacking an encapsulated housing.

The coldplate may further include a potting material received within the pocket. The potting material surrounds the DC link capacitor as an encapsulated unit or may directly surround a stack of film capacitors of the DC link capacitor.

DETAILED DESCRIPTION

Figure 1:
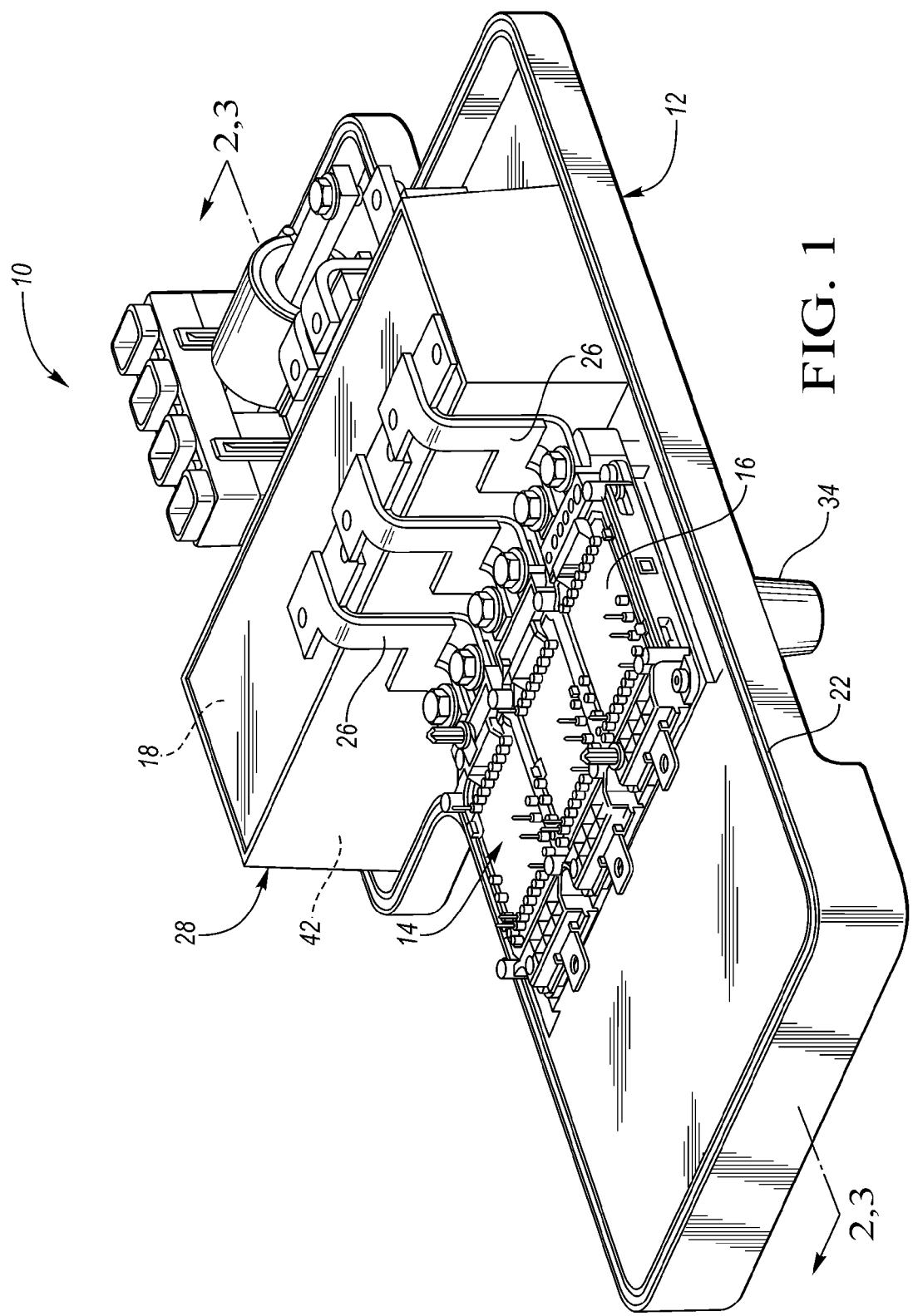
FIG. 1 illustrates a perspective view of an assembly including a coldplate and an inverter of an electric vehicle.

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

With reference to FIGS. 1, 2, 3, and 4, a more detailed description of an embodiment of a coldplate for use in cooling electrical components of inverters of electric vehicles will be described. For ease of illustration and to facilitate understanding, like reference numerals have been used herein for like components and features throughout the drawings.

As previously described, an inverter of an electric vehicle converts a DC voltage input supplied by the HV battery of the vehicle into an AC voltage output for powering the motor of the vehicle. The inverter includes switching modules and a DC link capacitor having film capacitors. The film capacitors of the DC link capacitor generate heat as a result of their operation. The generated heat may be dissipated using a coldplate provided as part of the inverter. However, a need exists for additional heat dissipation for the DC link capacitor beyond that which may be provided by standard coldplates currently in use.

A coldplate in accordance with the present disclosure satisfies this need. The coldplate satisfies this need by having a pocket sized to substantially surround the DC link capacitor when received in the pocket to provide physical integration of the DC link capacitor in the coldplate in order to facilitate dissipation of the heat generated by operation of the DC link capacitor.

Referring now to FIGS. 1, 2, 3, and 4, perspective, sectional, and cross-sectional views of an assembly 10 having a coldplate 12 and an inverter 14 of an electric vehicle and an exploded view of the cold plate are respectively shown.

Inverter 14 includes an integrated gate bipolar transistor (IGBT) switching module 16 and a DC link capacitor 18. IGBT switching module 16 and DC link capacitor 18 are provided in electrical communication with one another via bus bars 26. IGBT switching module 16 and DC link capacitor 18 are for use in converting a DC input voltage from the HV battery into an AC output voltage for powering the electric motor.

Figure 2:
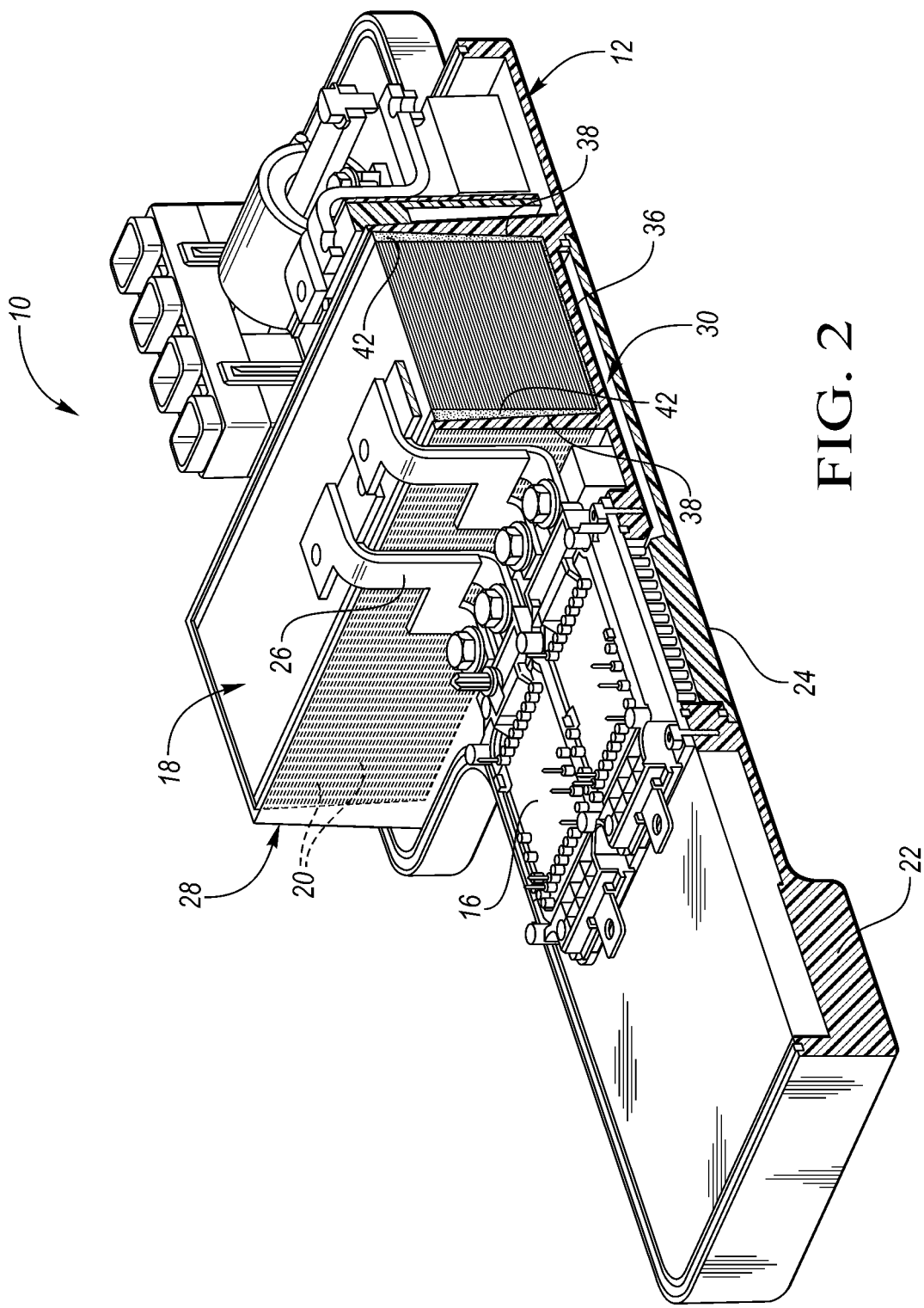
FIG. 2 illustrates a sectional view of the assembly.
Figure 3:
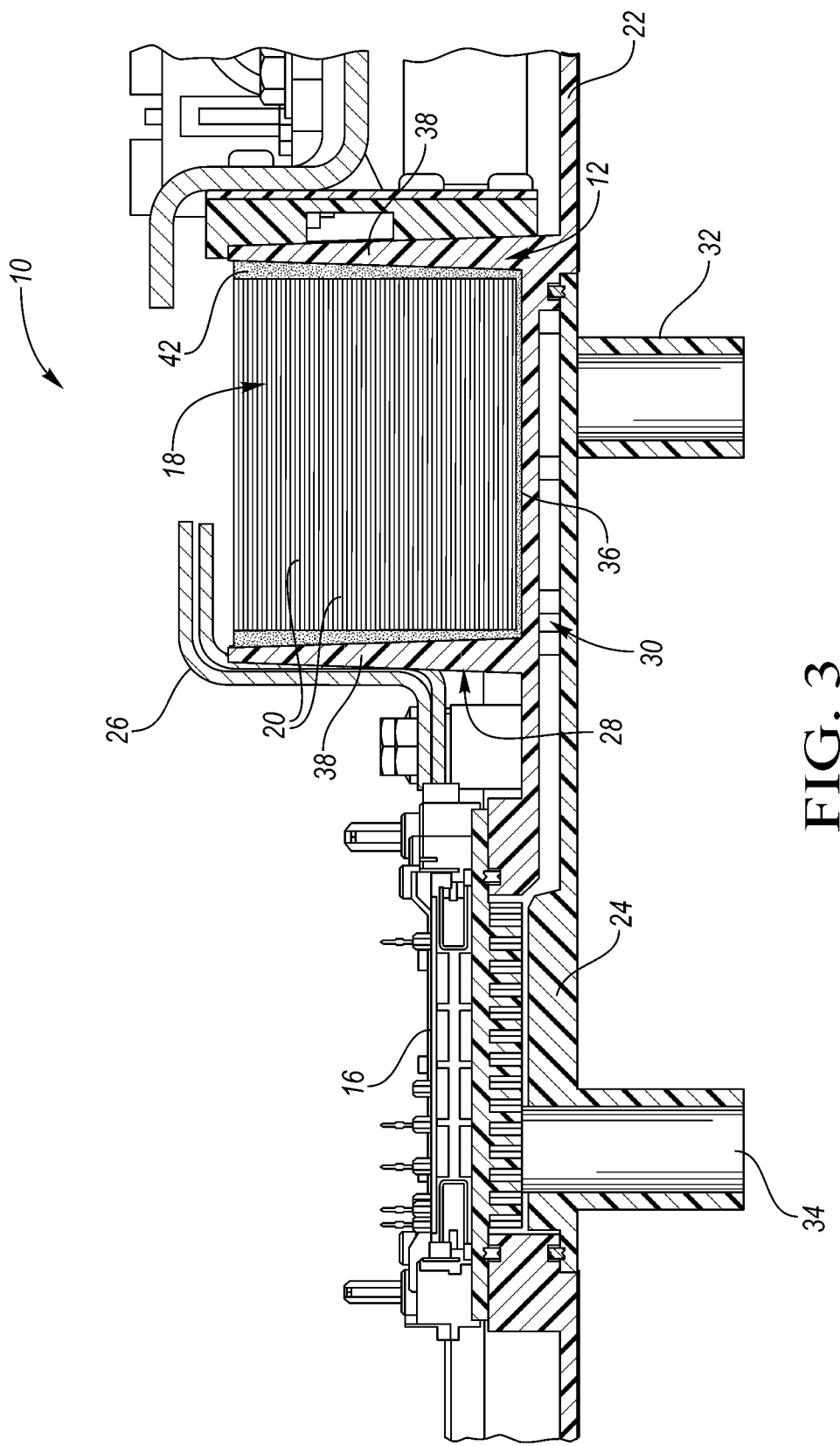
FIG. 3 illustrates a cross-sectional view of the assembly.
Figure 4:
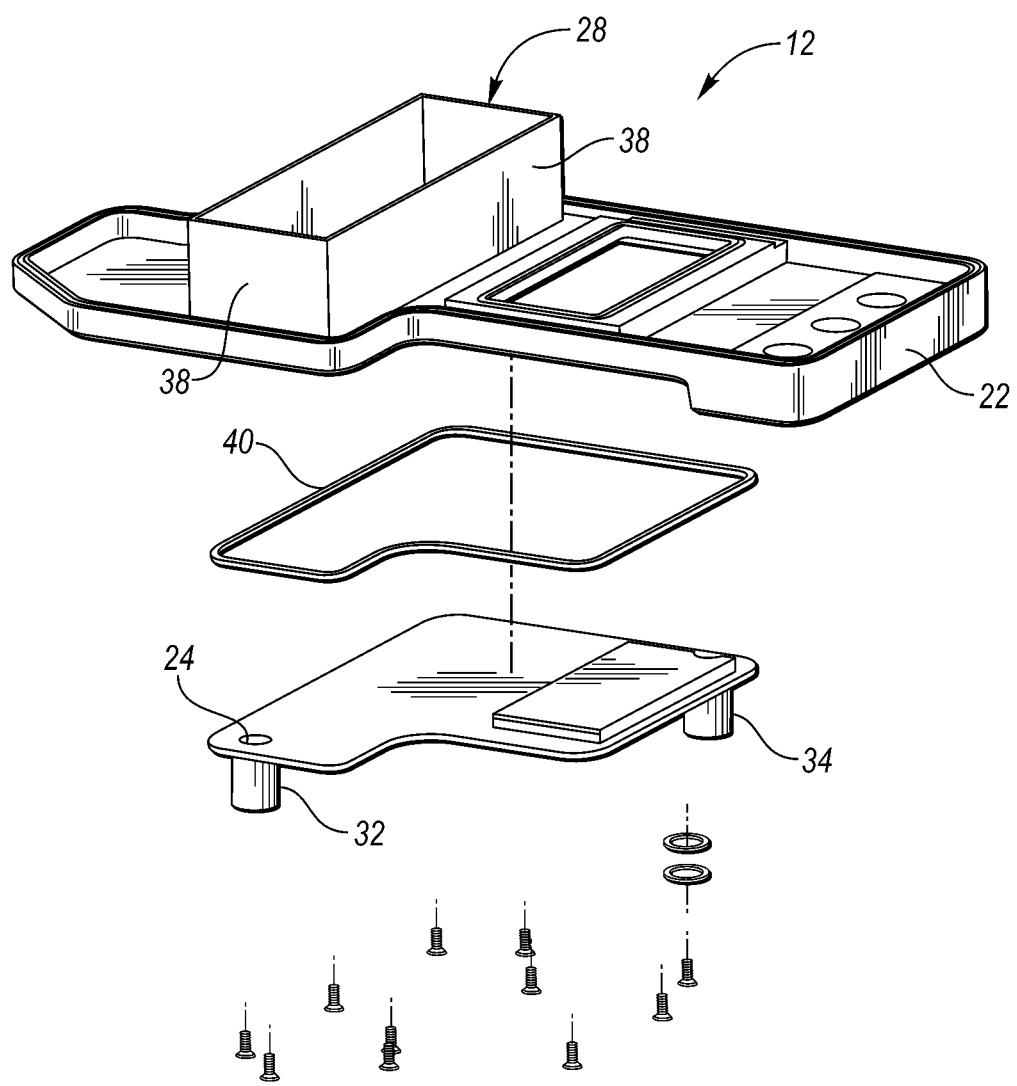
FIG. 4 illustrates an exploded view of the coldplate.

As seen in FIGS. 2 and 3, DC link capacitor 18 includes a plurality of film capacitors 20 configured in a stack. As seen in FIGS. 1, 2, and 3, DC link capacitor 18 including its stack of film capacitors 20 form a substantially rectangular prism, although other polygonal prism shapes may be employed.

Coldplate 12 includes a first coldplate member 22 (i.e., coldplate body) and a second coldplate member 24 (i.e., coldplate cover). Coldplate body 22 includes a top side and a bottom side. IGBT switching module 16 and DC link capacitor 18 are mounted onto the top side of coldplate body 22. The bottom side of coldplate body 22 and coldplate cover 24 are adapted to be joined together to form coldplate 12.

Coldplate 12, which acts as and may also be referred to as a heat extractor or heat sink, extracts, removes, and/or dissipates (collectively "dissipates") heat generated by IGBT switching module 16 and DC link capacitor 18. In that regard, coldplate body 22 and coldplate cover 24 may include any material known in the art for use in facilitating such cooling, such as a metal.

Coldplate body 22 includes a pocket 28 on the top side of the coldplate body. Pocket 28 opens outward from the top side of coldplate body 22. Pocket 28 is configured to receive DC link capacitor 18 including its stack of film capacitors 20. Pocket 28 is sized to substantially surround DC link capacitor 18 when the DC link capacitor is received in the pocket to thereby provide physical integration of the DC link capacitor in coldplate 12. This physical integration of DC link capacitor 18 in coldplate 12 enhances the functioning of the coldplate in dissipating heat generated by the DC link capacitor.

Coldplate body 22 and coldplate cover 24 may be adapted to be joined together to form a chamber, manifold, or channel 30 (collectively "channel"). Channel 30 is proximate the bottom side of coldplate body 22 underneath pocket 28 of the coldplate body. Channel 30 is for receiving a coolant (not shown) for use in cooling DC link capacitor 18 received in pocket 28. The coolant to be circulated through channel 30 may include any fluid known in the art for use in facilitating such cooling, such as water. In that regard, coldplate cover 24 may include a coolant inlet 32 and a coolant outlet 34 for use in circulating a coolant through the channel 30 to facilitate cooling of DC link capacitor 18 received in pocket 28 of coldplate body 22. Coldplate 12 further includes a coolant seal 40 positioned between coldplate body 22 and coldplate cover 24 for sealing channel 30.

Pocket 28 of coldplate body 22 includes a floor 36 and one or more walls 38 extending from the floor of the pocket. Floor 36 of pocket 28 is arranged on a portion of the top side of coldplate body 22. Walls 38 of pocket 28 rise out from the top side of coldplate body 22. Walls 38 of pocket 28 are configured such that the pocket has a shape of a substantially rectangular prism corresponding to the substantially rectangular prism shape of the stack of film capacitors 20 of DC link capacitor 18. Pocket 28 may have a depth substantially equal to a height of the stack of film capacitors 20 of DC link capacitor 18.

In accordance with the present disclosure, and as indicated in FIGS. 2 and 3, DC link capacitor 18 is a "naked" capacitor. That is, DC link capacitor 18 is not encapsulated (i.e., "potted") within its own casing. As such, film capacitors 20 of DC link capacitor 18 are exposed. DC link capacitor 18 in this naked state is received within pocket 28 of coldplate body 22. Without more, DC link capacitor 18 remains naked while received within pocket 28 of coldpate body 22. Operation of coldplate 12 in dissipating heat generated by DC link capacitor 18 can occur in this state.

However, pocket 28 of coldplate body 22 is further adapted to receive a potting material such that the potting material substantially surrounds the naked DC link capacitor 18 (more particularly, substantially surrounds film capacitors of the DC link capacitor) when received in the pocket. In that regard, such a potting material may provide heat transfer, electrical isolation, and/or mechanical support to DC link capacitor 18. The potting material may be any material known in the art suitable for any such purposes, (for example, a liquid gel). In this way, DC link capacitor 18 is "potted" within pocket 28. Such potting material provided within pocket 28 and/or the pocket itself enable DC link capacitor 18 to be integrated into coldplate body 22 and mounted thereto without the use of separate housings and/or fasteners, thereby reducing costs associated with coldplate 12 as well as improving cooling of the DC link capacitor.

Accordingly, in embodiments of a coldplate in accordance with the present disclosure, pocket 28 of coldplate body 22 receives therein DC link capacitor 18. DC link capacitor 18 may be a naked DC link capacitor. Pocket 28 may further receive therein a potting material 42. Potting material 42 within pocket 28 substantially surrounds DC link capacitor 18. Potting material 42 within pocket 28 substantially surrounds film capacitors 20 of DC link capacitor 18 when the DC link capacitor is a naked DC link capacitor. A coolant channel 30 may be proximate to (e.g., underneath) pocket 28. Bus bars 26, which electrically connect DC link capacitor 18 received within pocket 28 with IGBT switching module 16, extend into pocket 28 to make electrical contact with the DC link capacitor.

As is readily apparent from the foregoing, embodiments of a coldplate for use in cooling a DC link capacitor have been described. Such embodiments include a coldplate having a pocket sized to substantially surround the DC link capacitor when received in the pocket to provide physical integration of the DC link capacitor in the coldplate in order to facilitate dissipation of the heat generated by operation of the DC link capacitor. Such embodiments further include the DC link capacitor received in the pocket being a naked DC link capacitor and the pocket including a potting material which surrounds the DC link capacitor including its film capacitors.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. An assembly comprising:
a capacitor having a plurality of film capacitors, wherein the capacitor is not encapsulated within its own casing such that the film capacitors are exposed to an environment external to the capacitor;
a coldplate including a coldplate member including a pocket configured to receive the capacitor therein, the pocket being sized to surround the capacitor when the capacitor is received within the pocket to thereby provide physical integration of the capacitor in the coldplate member;
wherein the capacitor is received within the pocket to thereby be physically integrated in the coldplate; and
a potting material received within the pocket, the potting material substantially surrounding the film capacitors of the capacitor, wherein the potting material facilitates heat transfer from the film capacitors to the coldplate member via the pocket, provides electrical isolation to the film capacitors, and mechanically supports the film capacitors.

2. The assembly of claim 1 further comprising:
a second coldplate member; and
wherein the coldplate members are adapted to be joined together to form a manifold therebetween proximate to the pocket to receive a fluid for use in cooling the capacitor when the capacitor is received within the pocket.

3. The assembly of claim 1 wherein:
the pocket has a depth corresponding to a height of the capacitor.

4. The assembly of claim 1 wherein:
the pocket has a shape corresponding to a shape of the capacitor.

5. The assembly of claim 1 wherein:
the pocket includes a floor and one or more walls, the floor of the pocket being arranged on a side of the coldplate member and the walls of the pocket extending from the floor of the pocket outward from the side of the coldplate member whereby the pocket opens outward from the side of the coldplate member.

6. An assembly for an electric vehicle, the assembly comprising:
an inverter including a naked DC link capacitor having a stack of film capacitors and lacking an encapsulation housing such that the film capacitors are exposed to an environment external to the naked DC link capacitor;
a coldplate including a coldplate member having a pocket;
wherein the naked DC link capacitor is received within the pocket to thereby be physically integrated in the coldplate; and
a potting material received within the pocket, the potting material substantially surrounding the film capacitors of the naked DC link capacitor, wherein the potting material facilitates heat transfer from the film capacitors to the coldplate member via the pocket, provides electrical isolation to the film capacitors, and mechanically supports the film capacitors.

7. The assembly of claim 6 wherein:
the pocket includes a floor and one or more walls, the floor of the pocket being arranged on a side of the coldplate member and the walls of the pocket extending from the floor of the pocket outward from the side of the coldplate member whereby the pocket opens outward from the side of the coldplate member.

8. The assembly of claim 6 wherein:
the coldplate further includes a second coldplate member; and
the coldplate members are adapted to be joined together to form a manifold therebetween proximate to the pocket to receive a fluid for use in cooling the naked DC link capacitor.

9. The assembly of claim 6 wherein:
the pocket has a shape corresponding to a shape of the naked DC link capacitor.

* * * * *